US005210518A

United States Patent [19]
Graham et al.

[11] Patent Number: 5,210,518
[45] Date of Patent: May 11, 1993

[54] APPARATUS AND METHOD FOR REDUCING ERRORS IN DATA CAUSED BY NOISE

[75] Inventors: Martin H. Graham, Berkeley; Howard W. Johnson, Sunnyvale; Philip H. Sutterlin; Chin-Chen Lee, both of San Jose; Amy O. Hurlbut, San Francisco, all of Calif.

[73] Assignee: Echelon Corporation, Palo Alto, Calif.

[21] Appl. No.: 698,600

[22] Filed: May 10, 1991

[51] Int. Cl.⁵ .......................................... H04M 11/04
[52] U.S. Cl. ............................ 340/310 R; 340/310 A; 340/310 CP; 455/222; 455/223; 375/104
[58] Field of Search ........ 340/310 R, 310 A, 310 CP; 455/223, 222; 375/104

[56] References Cited
U.S. PATENT DOCUMENTS

| | | | |
|---|---|---|---|
| 3,783,387 | 1/1974 | Wernli | 455/212 |
| 4,030,034 | 6/1977 | Ruegg | 455/250.1 |
| 4,070,631 | 1/1978 | Nash et al. | 455/223 |
| 4,124,819 | 11/1978 | Hansen | 455/223 |
| 4,203,072 | 5/1980 | Beningfield et al. | 455/223 |
| 4,783,845 | 11/1988 | McChesney et al. | 375/104 |
| 4,835,517 | 5/1989 | van der Gracht et al. | 340/310 R |
| 4,845,466 | 7/1989 | Hariton et al. | 340/310 R |
| 4,922,493 | 5/1990 | Kase . | |
| 4,972,510 | 11/1990 | Guizerix et al. | 455/218 |
| 4,988,972 | 1/1991 | Takagi | 340/310 R |

FOREIGN PATENT DOCUMENTS 2003366  3/1979  United Kingdom ................ 455/223

OTHER PUBLICATIONS

IEEE Transactions on Communications, vol., 38, No., 8, Aug. 1990; *Errors-and-Erasures Coding to Combat Impuse Noise on Digital Subscriber Loops*, David H. Sargrad and James W. Modestino.

Primary Examiner—Jin F. Ng
Assistant Examiner—Edward Lefkowitz
Attorney, Agent, or Firm—Blakely, Sokoloff, Taylor & Zafman

[57] ABSTRACT

In a power line communications apparatus an improvement for blanking or snubbing impulse noise. The impulse noise is detected and used to snub the detected signal. The duration of the snubbing pulses is controlled to assure complete blanking of noise including the trailing noise signals following a main noise pulse which may not otherwise be detectable. Also, the number of snubbing pulses which can occur are limited to prevent too much energy from being snubbed during any given baud period.

2 Claims, 13 Drawing Sheets

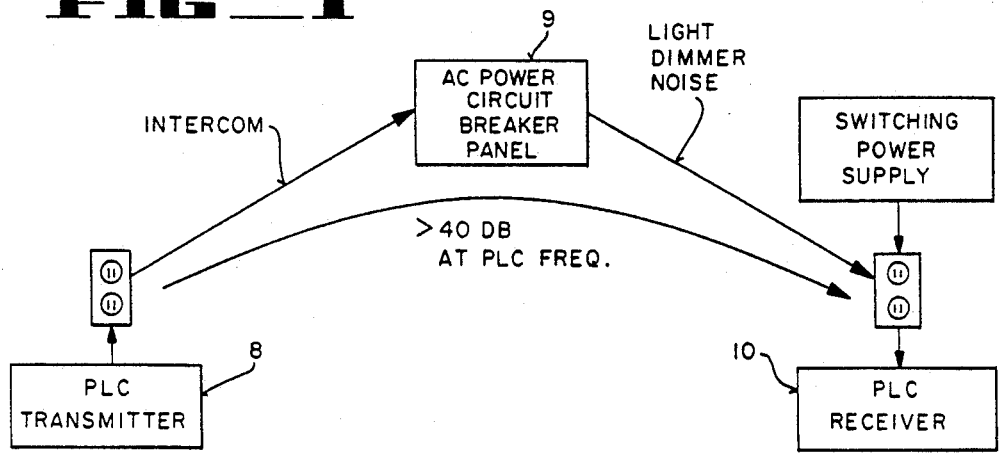
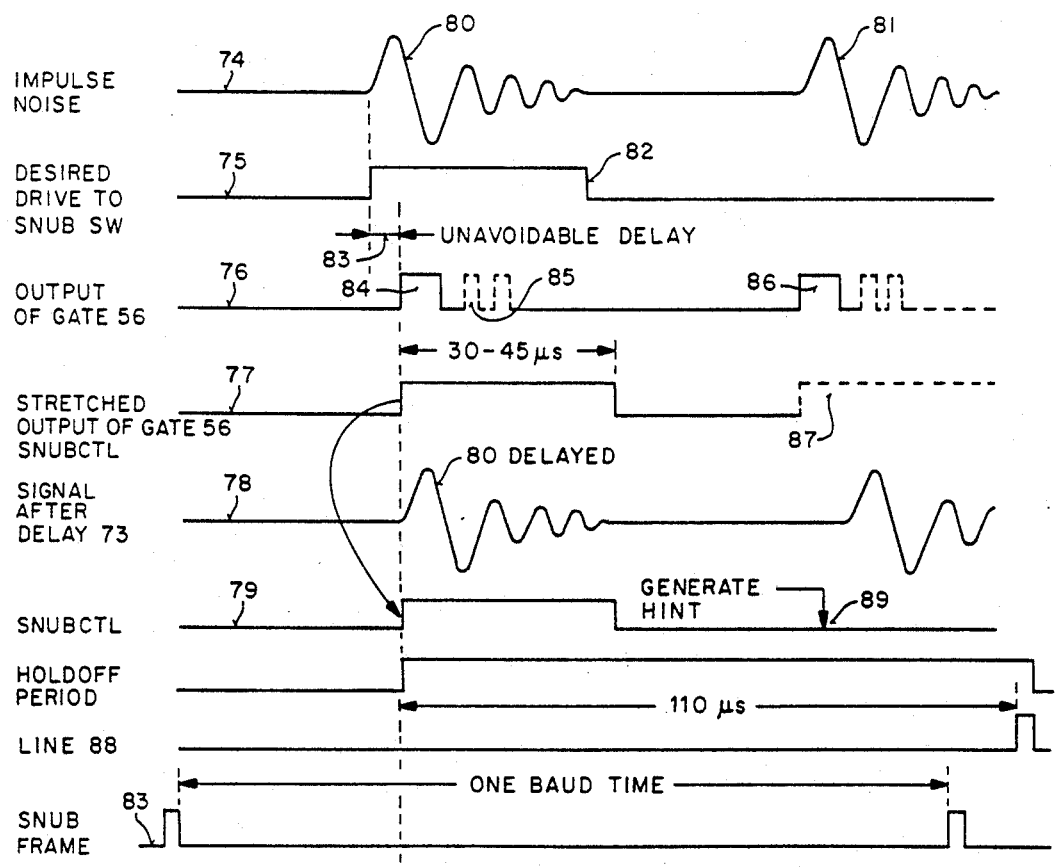

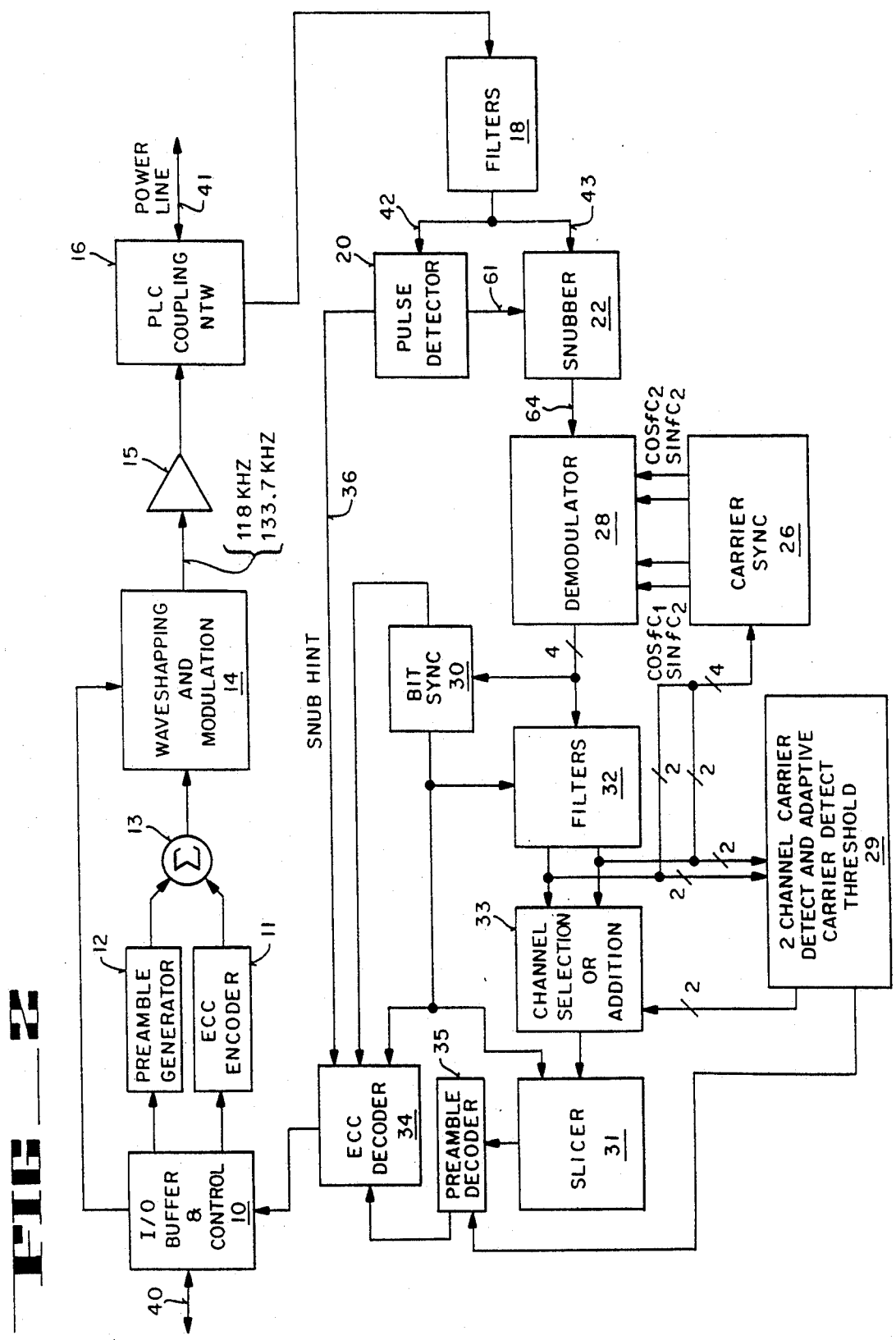

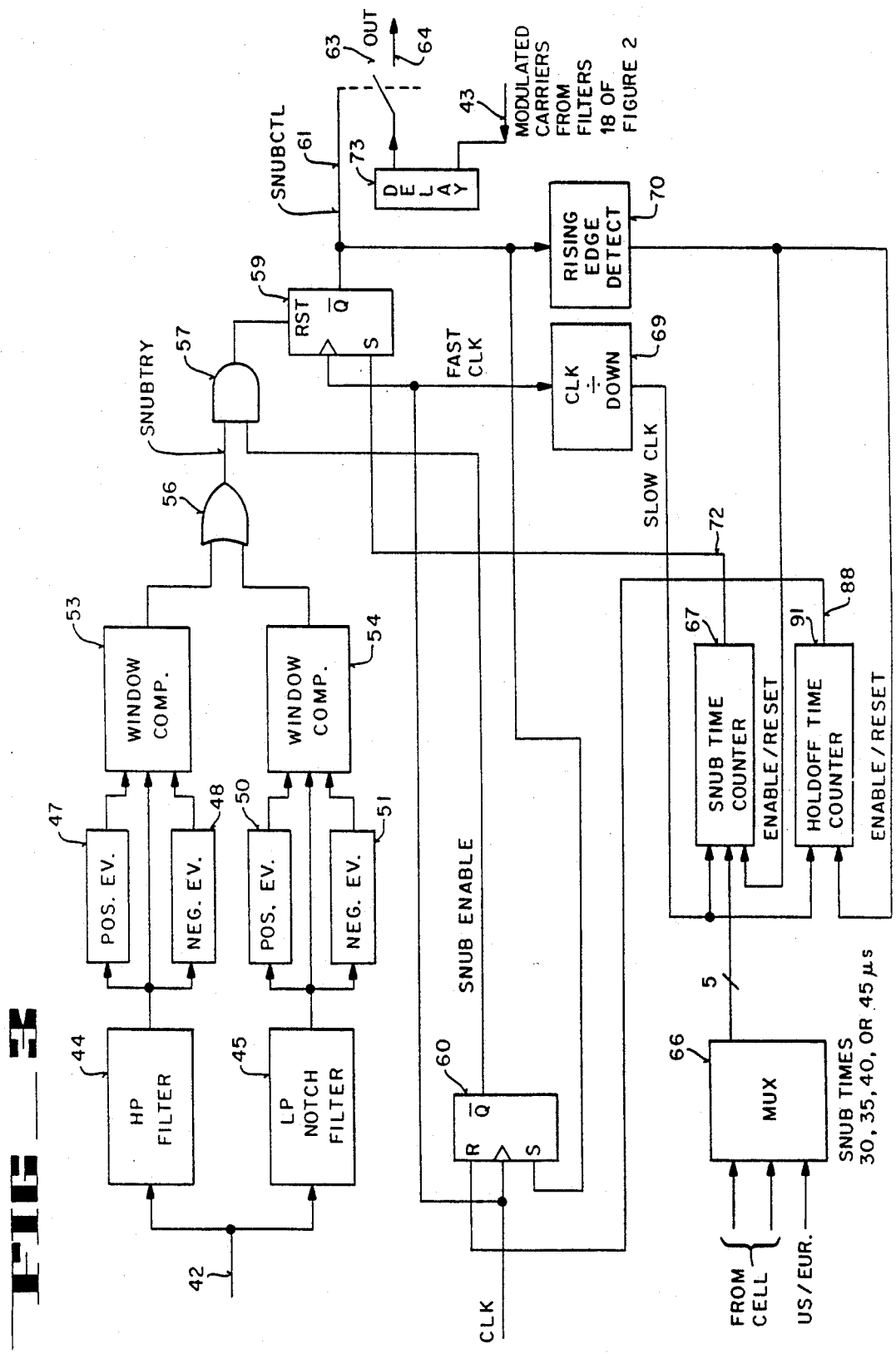

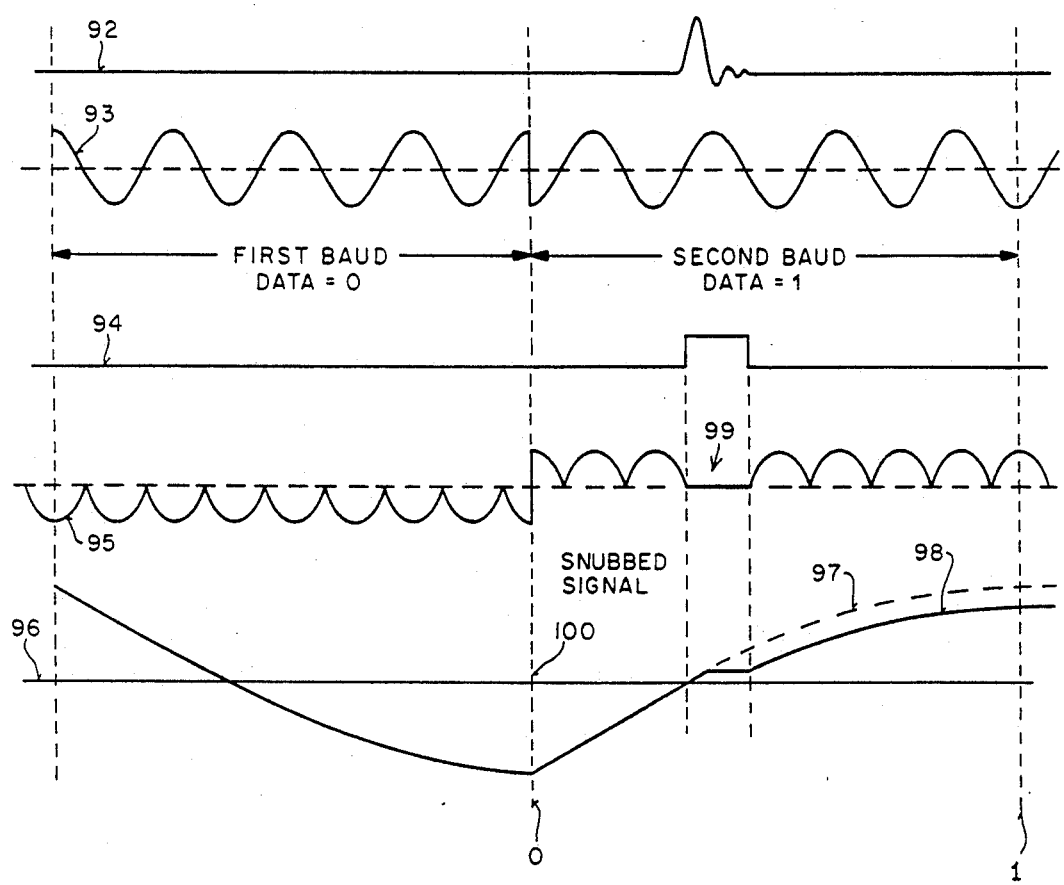

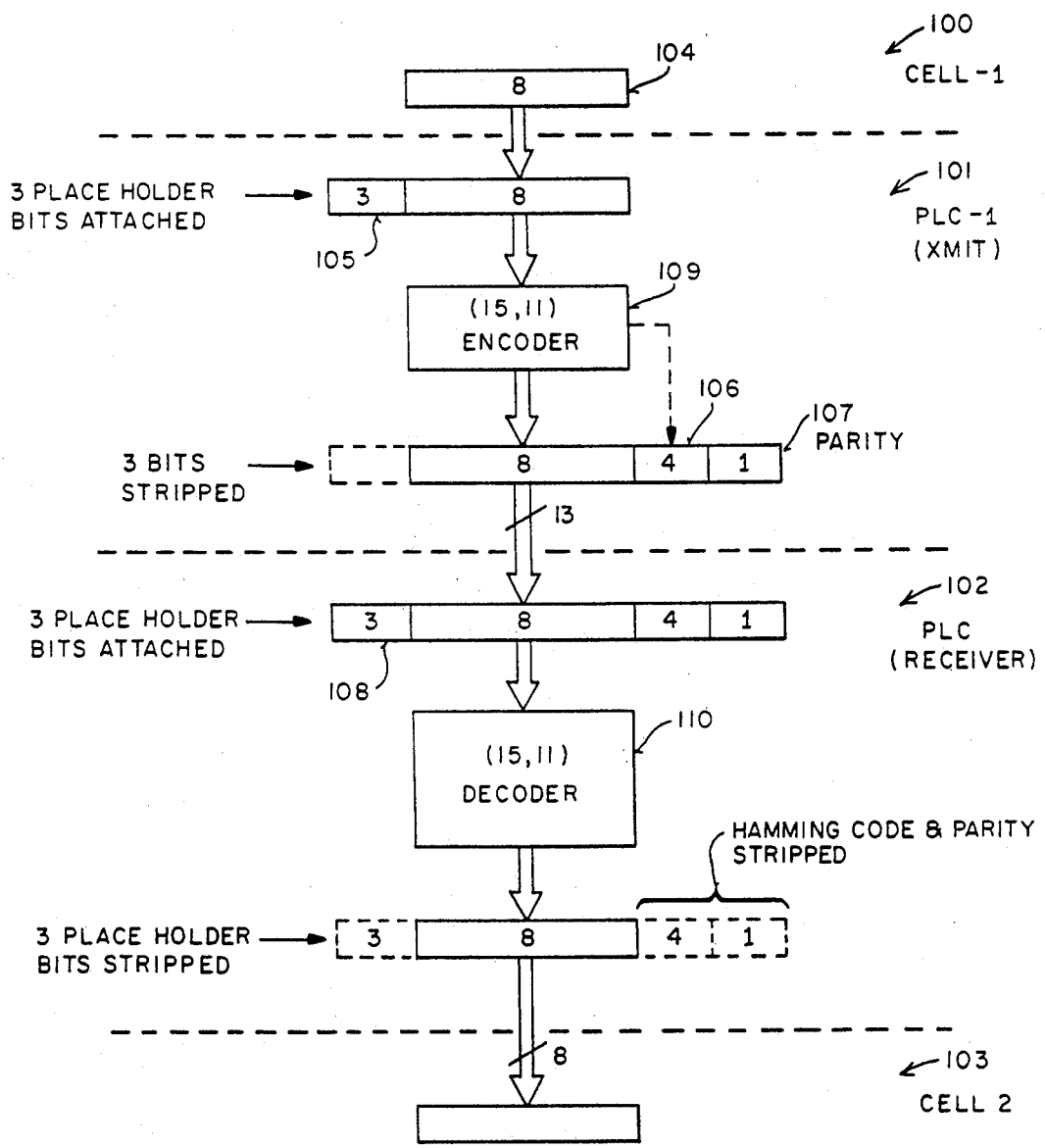

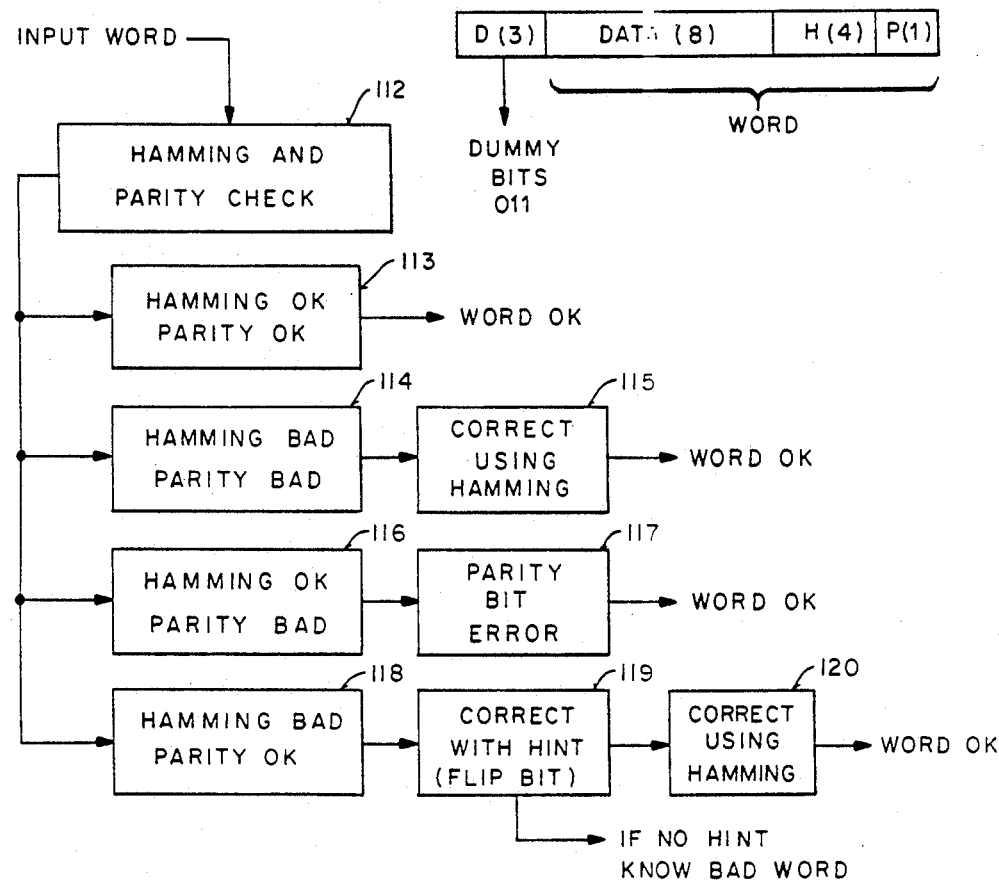
FIG_7
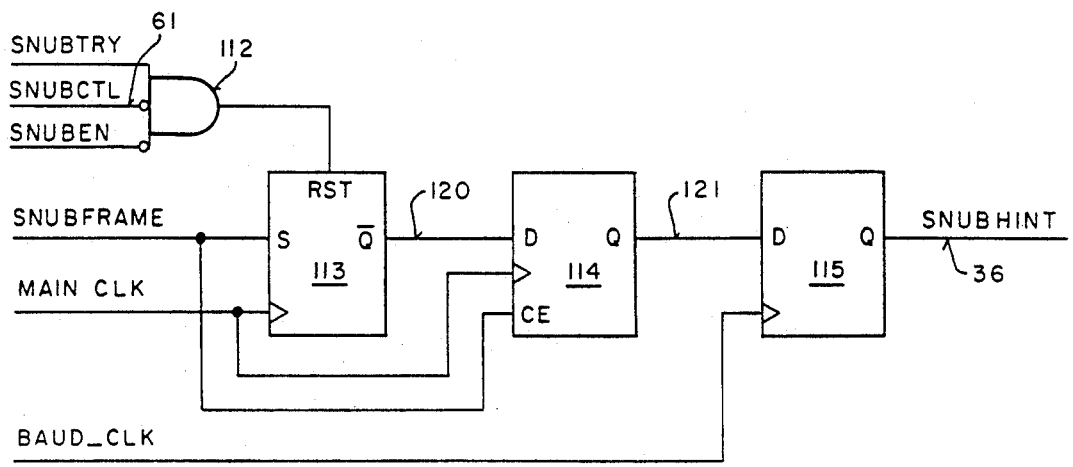
FIG_8 SNUB HINT GENERATOR

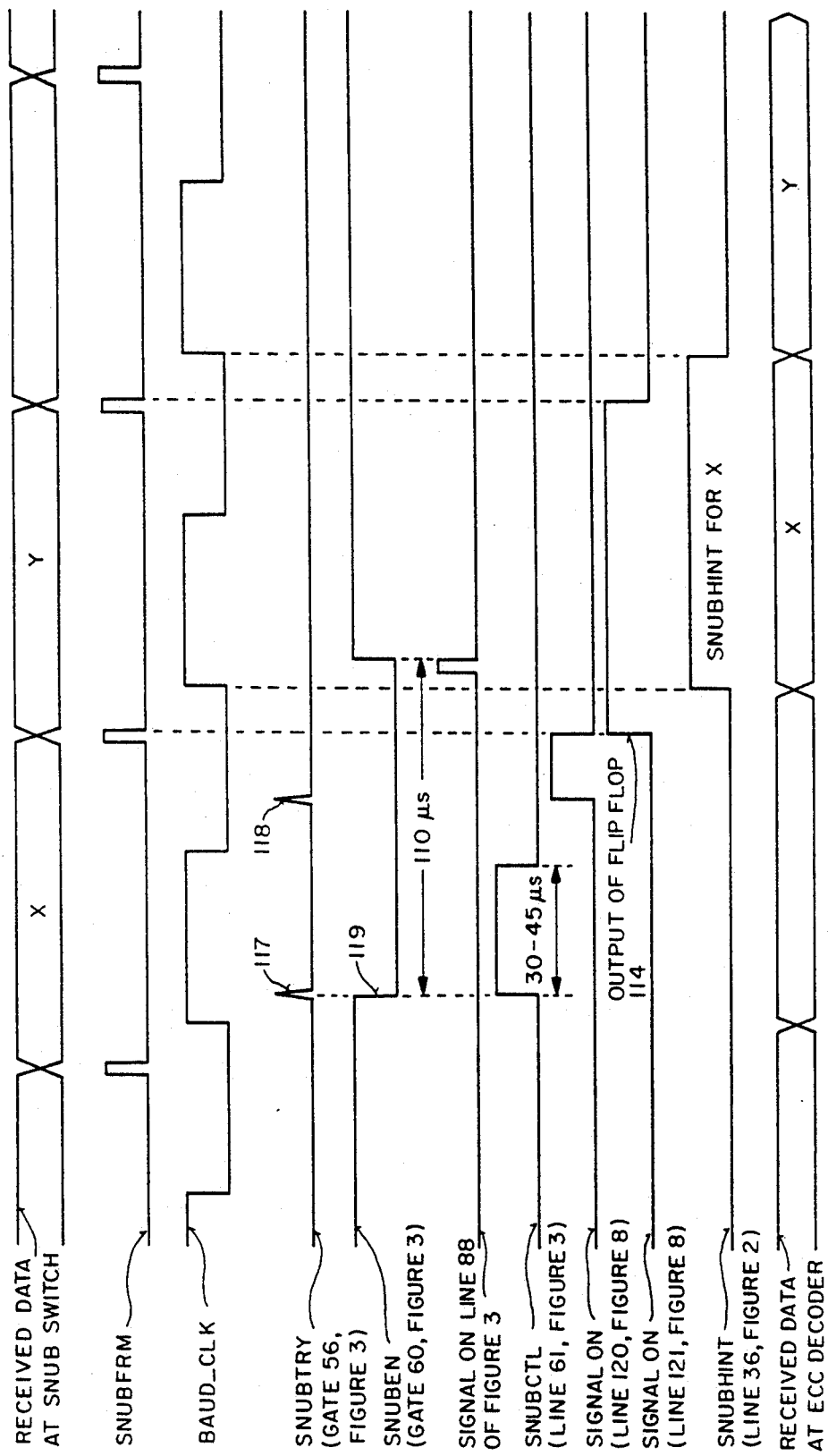

FIG_10
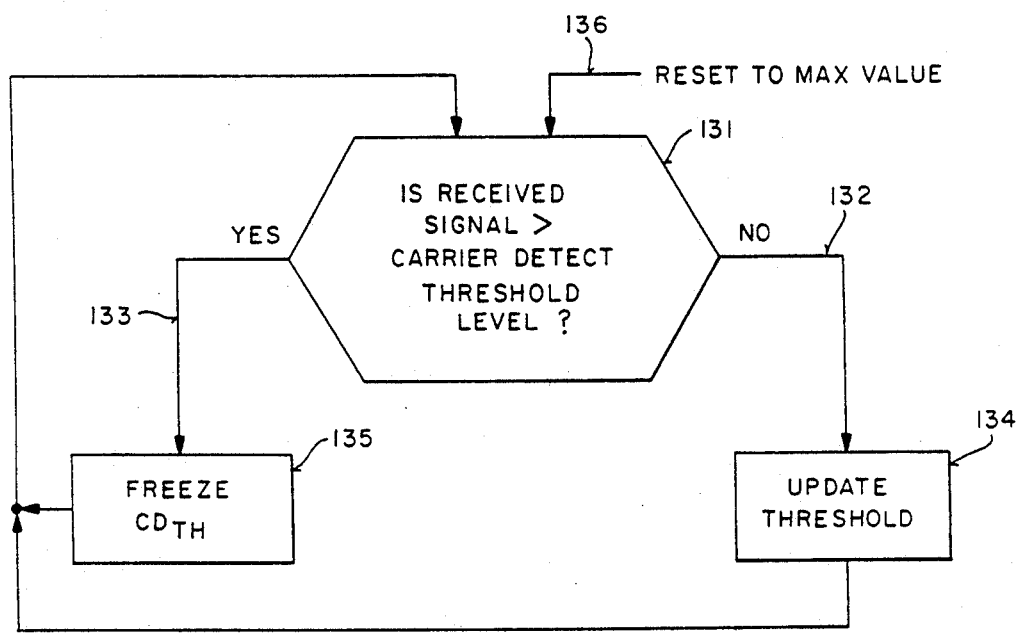
$138 \longrightarrow N_{AVG.(n+1)} = N_{AVG.(n)} + (N_{MAG.(n)} - N_{AVG.(n)}) \times 1/64$
$137 \longrightarrow CD_{TH(n+1)} = K \times N_{AVG.(n+1)}$

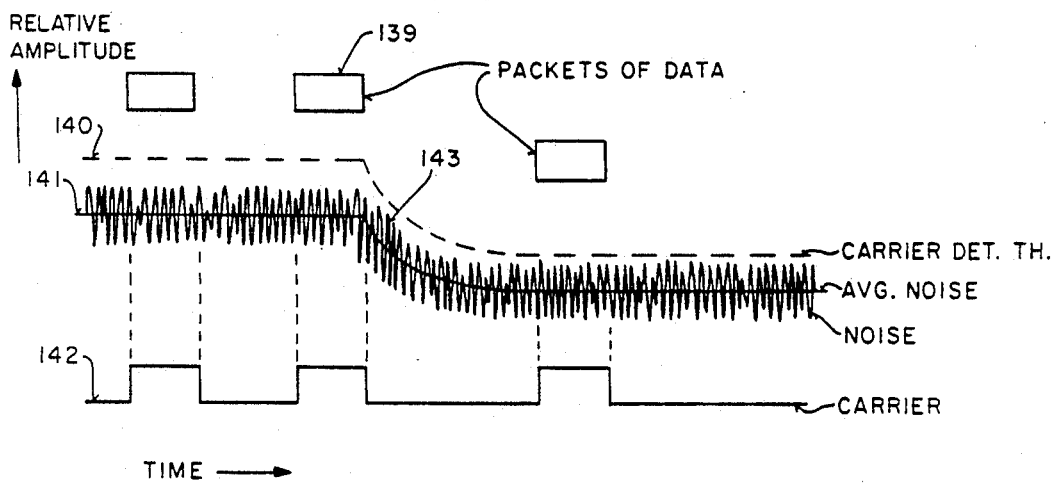
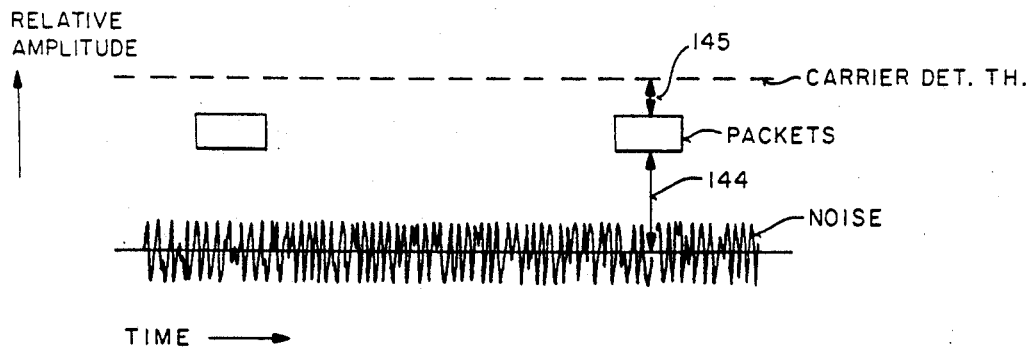
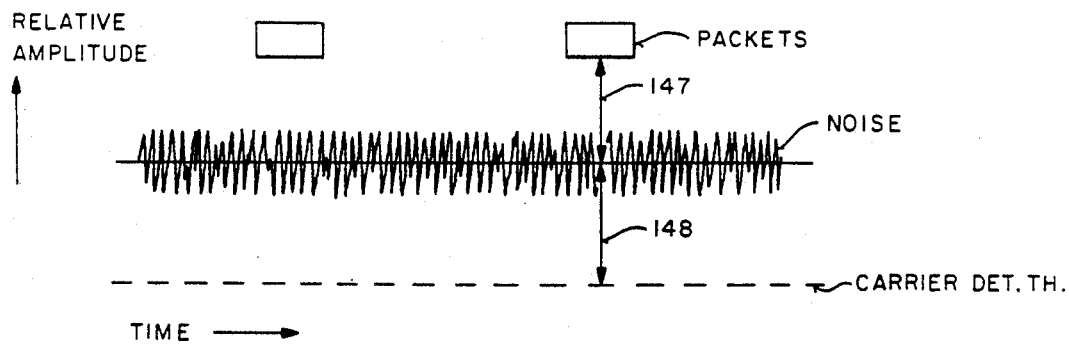

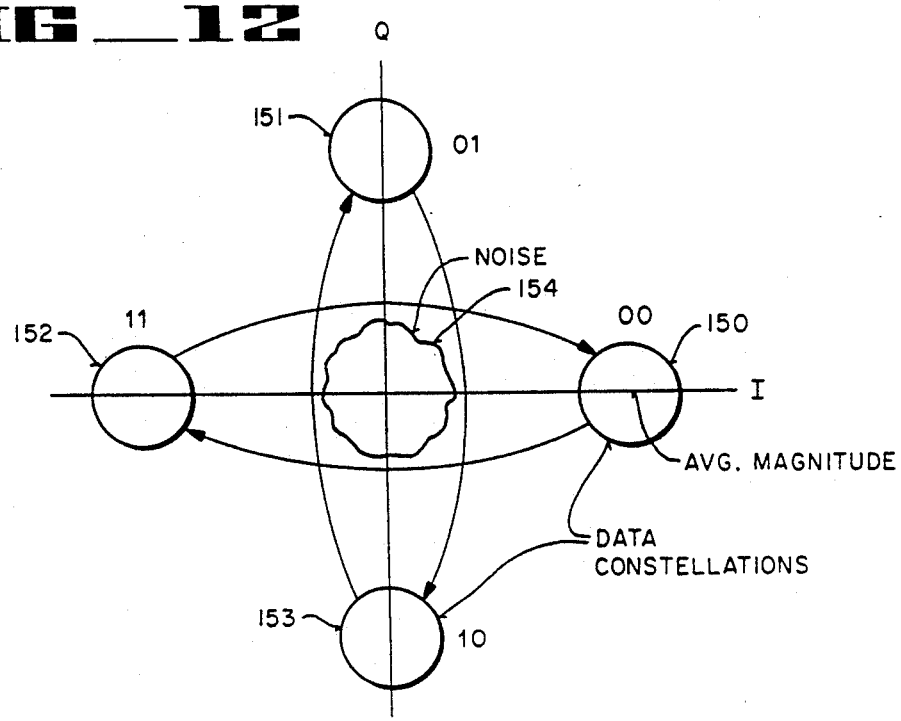
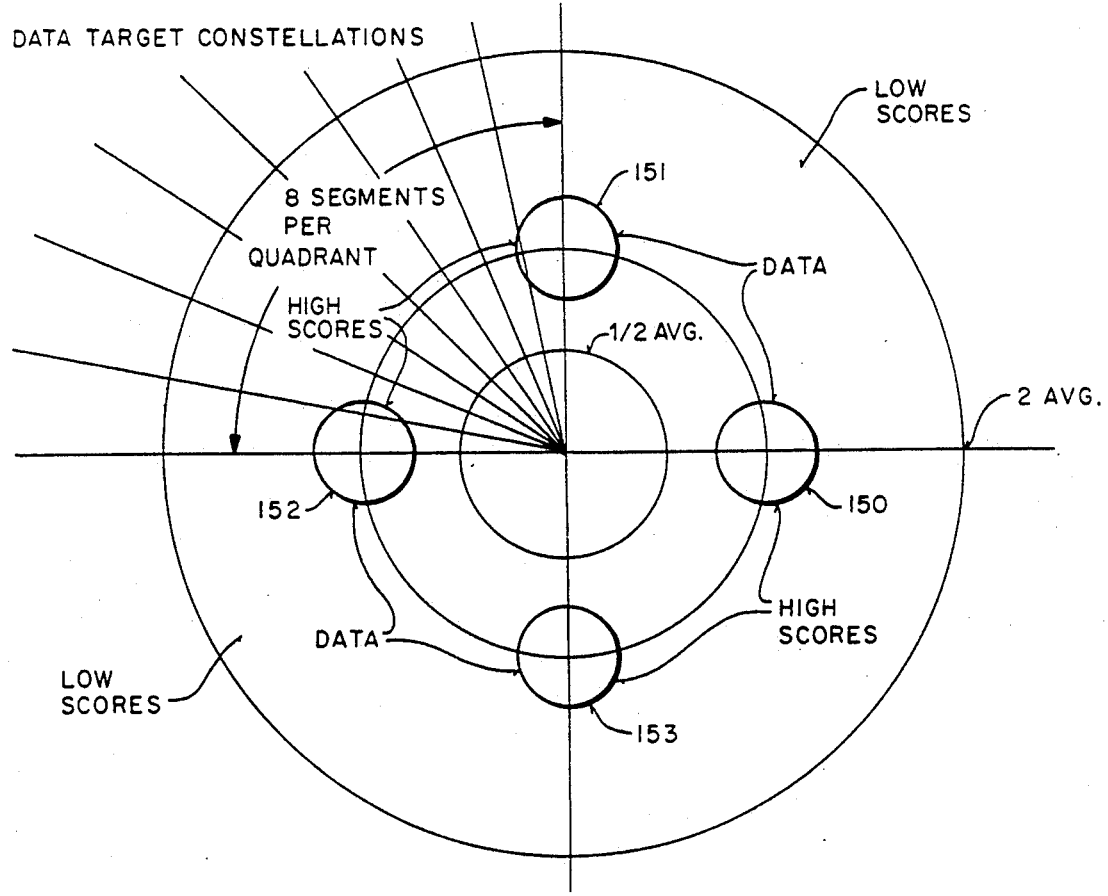

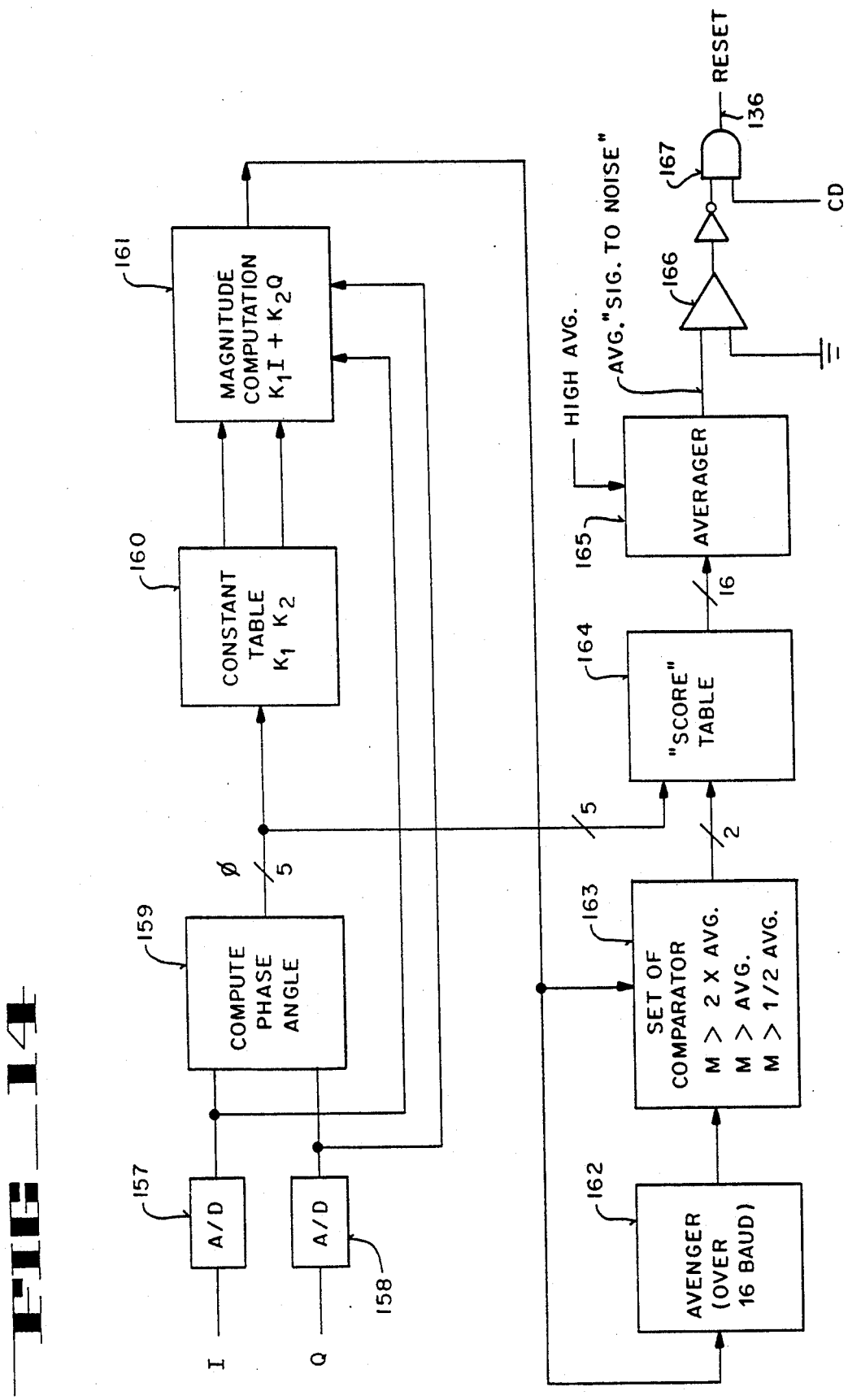
FIG_14

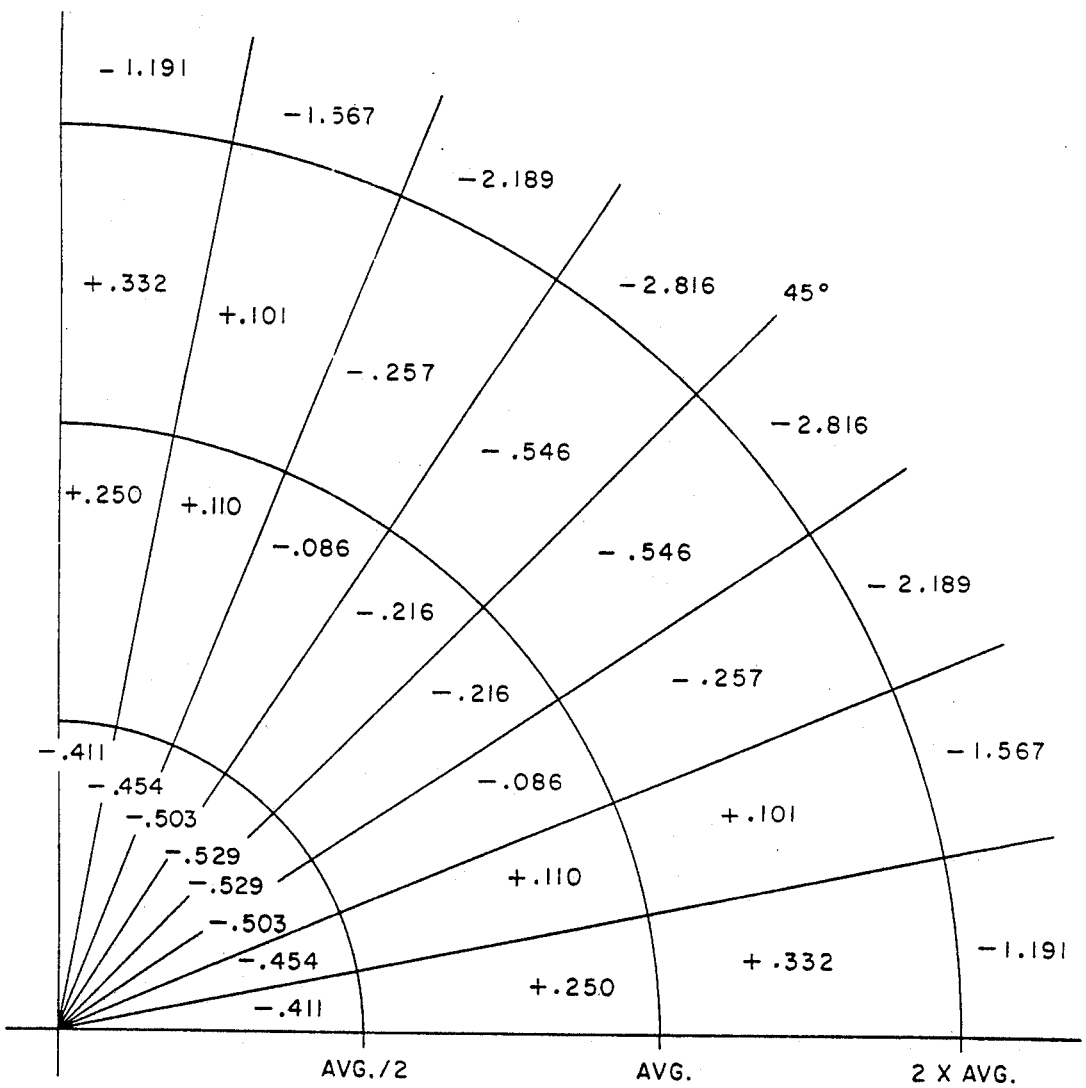
FIG _ 15
COEFFICIENTS FOR "SCORE" TABLE

FIG_16
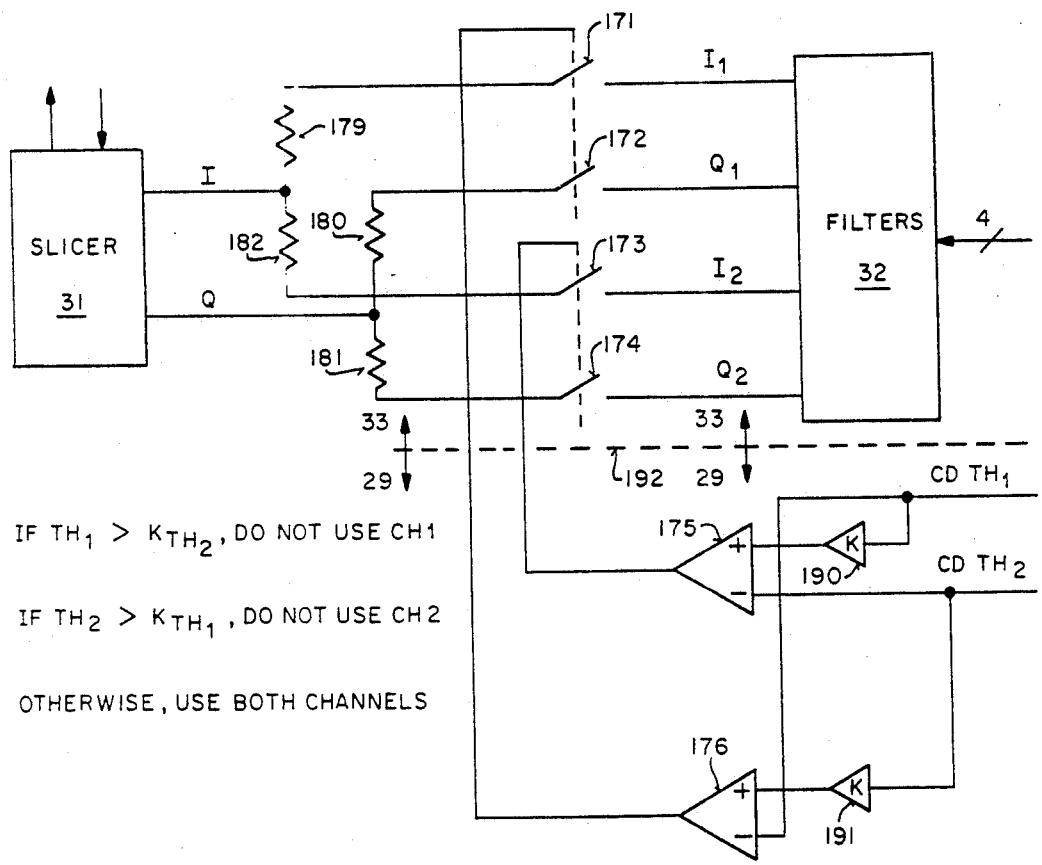
- IF $TH_1 > K_{TH_2}$, DO NOT USE CH1
- IF $TH_2 > K_{TH_1}$, DO NOT USE CH2
- OTHERWISE, USE BOTH CHANNELS
FIG_17
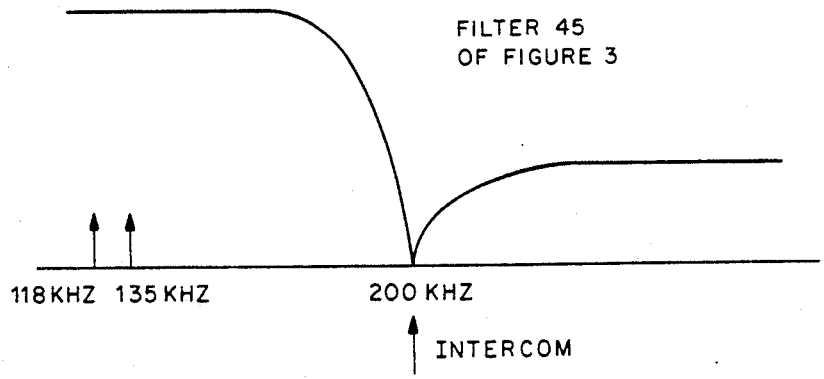

APPARATUS AND METHOD FOR REDUCING ERRORS IN DATA CAUSED BY NOISE

BACKGROUND OF THE INVENTION

1. Field of the Invention

The invention relates to the field of power line communications and, more particularly, transceivers enabling such communications.

2. Prior Art

U.S. Pat. No. 4,918,690 describes a system for providing sensing bidirectional communications and control. Communications between a plurality of cells enables, for example, control for switching and the like. The present invention provides a transceiver for power line communications which may be used with the system described in U.S. Pat. No. 4,918,690.

A major problem with power line communications is background noise including impulse noise. This noise originates not only from the power source and distribution network, but also from the loads. The noise is not constant with respect to time and moreover, it varies from place to place in a power distribution network. A theoretical analysis of impulse noise, particularly for a twisted pair, is described in "Errors-and-Erasures Coding to Combat Impulse Noise on Digital Subscriber Loops", *IEEE Transactions on Communications*, Vol. 38, No. 8, August 1990, beginning at page 1145. The present invention, as will be seen, employs snubbing or blanking to eradicate noise impulses. Applicant is not aware of this technique being applied to a digital system. Snubbing or blanking has been used in connection with radio receivers and its use is described in U.S. Pat. No. 4,124,819.

One commercially available system "X-10" provides sensing, control and communications over power lines. Coded patterns are transmitted twice, once in true form and a second time in complementary form on a modulated carrier. This technique provides only limited immunity to power line noise. One problem with this system and other systems is that the carrier detection threshold level is fixed. In selecting a threshold level for such a system, the level must be relatively high to provide some immunity from expected noise. This limits the operation of the system, for instance, where both the noise and signal are low. As will be seen, the present invention provides an adaptive carrier detection level.

In some communications systems, it is known to transmit information redundantly on on two channels and then to select the channel with the strongest signal at the receiver. This technique is used in wireless microphone systems. As will be seen, the present invention uses two channels, however, selection between one or the other (or both) channels is based on noise levels, not signal strength.

Data is often encoded with error correcting codes (ECC) such as Hamming codes to permit the detection and correction of errors. In the present invention, this coding is extended through use of a "hint" signal to locate possible errors. The hint signal is generated from an impulse noise detection circuit.

Another technique sometimes employed in power line communications is to use a spread spectrum. Once such power line communications apparatus is disclosed in U.S. Pat. No. 4,815,106.

SUMMARY OF THE INVENTION

An apparatus for receiving a modulated carrier modulated with binary signals and transmitted over a power line to the apparatus is described. Detection means are used for detecting noise pulses on the power line. A pulse generation means generates control pulses of predetermined duration, the duration of the pulses being independent of the duration of the noise pulses. A snubbing means for suppressing the carrier signal under control of control pulses is used. Means are also provided for limiting the number of snubbing pulses that can occur. Also, the snubbing is adaptive in that detection threshold levels are automatically adjusted to be above certain interfering signals.

BRIEF DESCRIPTION OF THE DRAWINGS

FIG. 1 is a diagram used to illustrate problems associating with power line communications.

FIG. 2 is a block diagram of the invented power line communications apparatus.

FIG. 3 is a block diagram of the pulse detector and snubber of FIG. 2.

FIG. 4 illustrates several waveforms used to explain the operation of the pulse detector and snubber of FIG. 3.

FIG. 5 illustrates several waveforms used to describe the effect of snubbing on a modulated carrier.

FIG. 6 illustrates the flow of data, Hamming code, and a parity bit in the present invention.

FIG. 7 is a diagram illustrating the implementation of a Hamming code in the present invention.

FIG. 8 is a circuit diagram of the snub hint generator of the present invention.

FIG. 9 illustrates several waveforms used to explain the operation of the circuit of FIG. 8.

FIG. 10 is a state diagram used to describe the mechanism for updating the carrier detection threshold level.

FIG. 11A illustrates a plurality of waveforms used to describe the condition when the carrier detection threshold level is above the average noise level.

FIG. 11B illustrates a plurality of waveforms used to describe the condition when the carrier detection threshold level is above the level of the carrier signal.

FIG. 11C illustrates a plurality of waveforms used to describe the condition when the carrier detection threshold level is below the noise level.

FIG. 12 is a diagram used to describe the locations of data constellations for a quadrature modulated signal.

FIG. 13 is a graph similar to that of FIG. 12 used to indicate the target areas where data should be located.

FIG. 14 is a block diagram of the currently preferred embodiment of a portion of the adaptive carrier detection circuit.

FIG. 15 is a graph illustrating the coefficient values used in the score table of FIG. 14.

FIG. 16 is a circuit diagram of the channel selection or addition circuit of FIG. 2.

FIG. 17 is a graph of the characteristics of a filter used in the pulse detector of FIG. 2.

DETAILED DESCRIPTION OF THE INVENTION

A power line communication (PLC) apparatus is described which enables communications over power lines between cells or other devices. The apparatus may be realized either with discrete components or as an integrated circuit formed on a single substrate employing well-known complimentary metal-oxide-semiconductor (CMOS) technology or other semiconductor processing technologies.

In the following description numerous specific details are set forth, such as specific frequencies. These details are provided to enable one to fully appreciate and understand the present invention. It will be obvious to one skilled in the art that the present invention may be practiced without these specific details. In other instances, well-known circuits have been shown in block diagram form in order not to unnecessarily obscure the present invention in detail.

Most blocks are described here as circuits implying an analog implementation. It will be obvious to one skilled in the art that many of the blocks may be implemented as continuous time analog circuits, as discrete-time analog circuits (i.e., switched capacitor circuits), as dedicated digital signal processing hardware, or as software on a digital processor with no change to their overall function and purpose. The continuous time analog descriptions in some cases in this application is adopted for clarity of description and in order to provide a better understanding and appreciation of the present invention.

Problem Associated with Power Line Communications

To appreciate the present invention, it will be helpful to understand some of the problems associated with communicating over power lines. The power lines referred to are typically used to distribute 50 or 60 Hz A.C. power, although in some cases higher frequencies are used such as 400 Hz in aircraft or lower frequencies such as 25 Hz in some rail systems. The power line communication signals are transmitted over the same lines that carry the power by modulating a higher frequency carrier signal. For instance, a 150 kHz carrier may be used to communicate digital signals over the power lines at a baud rate of 10 kB.

In co-pending Ser. No. 586,458, entitled METHOD AND APPARATUS FOR POWER LINE COMMUNICATIONS, assigned to the Assignee of the present application, a method and apparatus is disclosed for coupling power line communication devices into a power distribution network. Such coupling may be used in conjunction with the present invention. Also in U.S. Pat. No. 4,918,690, a system for sensing, communicating and controlling is disclosed which includes cells that may be coupled to power lines through the apparatus of the present invention.

Referring to FIG. 1, a power line communication transmitter 8 is illustrated connected into a typical household electrical receptacle. The transmitter 8 may be embedded within the receptacle to control another outlet. For purposes of discussion, assume the transmitter 8 transmits signals to a PLC receiver 10 which controls an appliance coupled into the receptacle associated with receiver 10. The communications path between the transmitter 8 and receiver 10, as illustrated, passes through a circuit breaker panel. This is often the case where one of the receptacles is on one branch circuit and the other on another branch circuit. A signal transmitted by transmitter 8 at, for example, 150 kHz may be attenuated by more than 40 dB before reaching the receiver 10. As can be appreciated, if the transmitter 8 is transmitting with a one volt output, the voltage at receiver 10 will be substantially diminished.

There are numerous sources of noise and other transients associated with power lines distribution system that make it difficult to receive and/or reconstruct signals from a PLC transmitter. One source of noise is an electronic dimmer which "chops" the A.C. waveform. Another example of noise is a switching power supply, frequently used in personal computers, which produce high frequency noise bursts (e.g., 25 kHz or greater). Other sources of noise found in a home or commercial environment include intercoms, electric motors, televisions and numerous others. Consequently, the receiver 10 must be able to ferret out the communications signal from the noise on the power line. (While in the above discussion, a separate transmitter and receiver are shown, typically the functions of transmitting and receiving are combined into a single device.)

Overall Block Diagram of the Currently Preferred Embodiment of the Invented Power Line Communications Apparatus Referring now to FIG. 2, the upper portion of the block diagram is the transmit section of the PLC apparatus while the lower portion of FIG. 2 is the receive section. The transmit section is included here for clarity. The transmit section is not the subject of the present invention. This latter section receives signals over the power line 41, processes them, then couples the resultant digital signal to the I/O buffer and control circuit 17. From there, the signals are coupled over lines 40 to a cell or other device. The lines 40 may communicate with a cell such as described in U.S. Pat. No. 4,918,690. Certain aspects of the circuit 10 are described in co-pending application "Transceiver Interface", Ser. No. 676,948, filed Mar. 28, 1991, assigned to the Assignee of the present invention.

The data to be transmitted, which arrives from the cell over lines 40 is coupled to an error correcting code encoder 11. The data is encoded, in the currently preferred embodiment, with a (15,11) Hamming code, meaning that 4 bits of error correction code are appended to each 11 bit data word. The encoding may be done in an ordinary manner, however, since 8-bit data words are encoded, means are provided for incorporating "dummy" or placeholder bits with each byte both during encoding and decoding as will be described in conjunction with FIG. 6. A parity bit is also transmitted with each word. Data is transmitted from the cell onto the power line in packets with the preamble generator 12 providing a preamble for the packets. At summer 13 the preamble is positioned in front of the packets of encoded data from the encoder 11. Consequently, the summer 13 performs a multiplexing function in that it selects either the data or preamble. Details of the preamble generator 12 and preamble decoder 35 of the currently preferred embodiment are described in co-pending application "Data Rate Detection" Ser. No. 698,445, filed May 10, 1991, assigned to the Assignee of the present application.

The output of the summer 13 is coupled to a waveshaping and modulating circuit 14. In the currently preferred embodiment, this circuit includes a read-only-memory, digital-to-analog converter and two filters. (The filters in the integrated circuit embodiment of the present invention are switched capacitor filters.) Certain aspects of the waveshaping and modulation circuit 14 are described in co-pending application "Carrier Frequency Derivation" Ser. No. 698,676, filed May 10, 1991, assigned to the Assignee of the present invention. Other circuits for performing these functions are well-known in the prior art.

With the invented apparatus, the data is transmitted in its entirety on two channels, that is, there is redundancy in the transmission. All the data (including the preamble) modulates both a 118 kHz carrier and a 133.7 kHz carrier for PLC apparatuses designed for use in the United States. (Other carrier frequencies are used for other countries to comply with different regulations.) The frequency separation between the frequencies is discussed in conjunction with the channel selection or addition circuit 33 of FIG. 16. While the data is transmitted on both channels, the receiver selects one or both channels, as will be described.

Quadrature phase shift keying (QPSK) is used to modulate the carriers under most operations. However, BPSK is also used as described in the above mentioned applications. BPSK signaling, at half the bit rate of QPSK signaling, is more immune to noise than QPSK but slower. The BPSK signaling scheme has the same receiver structure as QPSK, but uses only a two-point subset of the fourpoint QPSK signaling constellation. The BPSK signaling scheme communicates one bit of digital information in every signaling baud period. (Data bit rate and baud rate are equal.) The QPSK signaling scheme communicates two bits of digital information in every signaling baud period (data bit rate is twice the baud rate). The signaling baud rates for BPSK and QPSK signaling determined by physical parameters of the receiver filters are the same. In some of the examples below BPSK is discussed since it is easier to understand of the present invention when the bit rate is equal to the baud rate.

The output of the waveshaping and modulation circuit 14 is coupled to an amplifier 15 and from there to the power line 41 through a power line coupling network 16. As currently preferred, the amplifier 15 and network 16 are fabricated from discrete components. The amplifier 15 and network 16 are described in copending application "Improved Power Line Coupling Network" Ser. No. 678,525, filed May 10, 1991 and Drive Amplifier for Power Line Communications Ser. No. 698,455, filed May 10, 1991, both are assigned to the Assignee of the present invention.

Signals received on the power line 41 are coupled through the network 16 to the filters 18. Filters 18 again comprise switched capacitor filters for the integrated circuit embodiment. The filters 18 comprise a high pass filter and a low pass filter. The high pass filter has a cut-off frequency of approximately 90–110 kHz, and the low pass filter, a cut-off frequency of approximately 320 kHz. The filters 18 thus pass the modulated carriers and additionally the filters 18 pass certain noise.

The pulse detector 20 receives the output of the filters 18 (node 42). The detector 20 detects anomalies in the waveform such as noise pulses or other excursions of the waveform above or below certain threshold levels. For example, the pulse detector 20 detects noise associated with a light dimmer and other sources of noise pulses. The pulse detector 20 provides a snubber control signal to a snubber 22 on line 61. The snubber 22 blanks or snubs the signals from filters 18 for predetermined periods when a pulse representing a disturbance (noise pulse) is present in the received signal.

The pulse detector 20 and snubber 22 are described in conjunction with FIG. 3. The output of the snubber 22 which is the main received signal path is coupled to demodulator 28 on line 64. The carrier synchronization circuit 26 provides COS $fc1$, SIN $fc1$, COS $fc2$ and SIN $fc2$ to the demodulator 28. Four signals are coupled from the demodulator 28 to the circuit 26 (two for each channel). As mentioned above, two carriers are used and hence two channels are needed; one for the 118 kHz signal and the other for the 133.7 kHz signal. The demodulator 28 under control of the output of detector 26, demodulates the two carrier signals and provides both an in-phase and quadrature phase signal for each of the two channels to the filters 32. The output of the demodulator 28 is also coupled to a bit (baud) synchronization circuit 30. This circuit provides baud synchronization to the decoder 34 as well as other circuits. Circuit 30 also provides snub frame timing signals shown in FIG. 9 and elsewhere. The demodulator 28 and bit synchronization circuit 30 are ordinary, well-known circuits except as discussed herein. The two channel carrier detect and adaptive carrier detect threshold circuit 29 uses an adaptive threshold level which is described in conjunction with FIGS. 10–15.

The filters 32 comprise four matched filters, two for each channel. These filters may be of ordinary design for the illustrated use.

The output of the filters 32 are coupled to the channel selection or addition circuit 33. This circuit receives two control (selection) signals from the circuit 29. Within circuit 33, the data from one channel or the other from filters 32 is selected and forwarded to the bit slicer 31, or the data in both channels is added together and forwarded to the bit slicer 31. (Note: the same data in present in both channels.) In summary, if the noise in one channel is high, relative to noise in the other channel, the channel with the lesser noise is selected. If the noise is both channels is approximately equal, the signals in the channels are added. Details of this circuit are described in conjunction with FIG. 16.

The output from circuit 33 is coupled to the slicer 31 where the waveform is converted to a digital form in an ordinary manner under control of the bit synchronization signal. The output of circuit 33 is shown by the waveform on line 96 of FIG. 5. The slicer 31 provides the binary 1 or 0 levels by detecting the signal level at, for example, time 100. (This diagram shows BPSK for purposes of explanation. In the QPSK case two signals are forwarded from the channel selection circuit 33 to the slicer 31 and the slicer outputs two bits per signaling baud.)

The signal from slicer 31 is coupled to the preamble decoder 35 where the preamble is stripped off. The output of decoder 35 is coupled to the ECC decoder 34. Here, it is determined whether an error occurred in the transmission and if so, it is corrected with the Hamming code as will be explained. Additionally, a parity bit is transmitted with each word enabling the detection of a second error in each byte. One novelty of the present invention is the use of a "hint" from the pulse detector 20 which permits correction of a second transmission error in each byte under certain conditions. In summary, the position along the modulated waveform where an unsnubbed noise pulse occurs provides the hint as to where an error may have occurred in the data. A hint signal is transmitted on line 36 to the decoder 34 allowing the decoder to know where in the data stream the noise pulse occurred, and thus, where it is likely that an error may have occurred. The use of the hint in connection with the decoder 34 is described in conjunction with FIGS. 3 through 9.

The decoded data is coupled from the decoder 34 to the input/output buffer and control circuit 17 and from there to the cell or other device over lines 40.

While in the following description analog signals are sometimes discussed since they are used in the currently preferred embodiment, the present invention may be realized using digital signal processing (DSP) techniques. For instance, as mentioned the signal path from the output of filters 18 through the slicer 31 can be fabricated with DSP techniques.

Pulse Detection and Snubbing Circuits and Their Operation

In FIG. 3, the pulse detector 20 and snubber 22 of FIG. 2 are shown in detail. The input to the snubber 22 of FIG. 2 (node 43), is shown in FIG. 3 on the right edge of the figure. Node 43 is coupled to a delay circuit 73 to delay the modulated carriers for reasons which will be explained. The delayed signal is the output signal on line 64. This signal is snubbed through an analog switch 63; that is, the received signal (carriers and noise pulses) are selectively blanked under control of the snub control (SNUBCTL) signal which signal operates the switch 63. The remainder of the circuitry of FIG. 3 generates the SNUBCTL signal.

The input to the pulse detector 20 (node 42) of FIG. 2 is shown in the upper left corner of FIG. 3. Node 42 is coupled to the inputs of filters 44 and 45. The high pass filter 44 has a cut-off frequency of approximately 150 kHz hence, the output of filter 44 consists approximately of the band 150-320 kHz (this band excludes the carriers). The output of the filter 44 is coupled to a positive envelope detector 47 and a negative envelope detector 48. Also, this filter's output is coupled directly to a window comparator 53. The outputs of the positive and negative envelope detectors provide envelope threshold signals which are proportional to the background noise. Signals at the output of the filter 44 which are greater than the envelopes by a certain amount (either in the positive or negative sense) are detected within the window comparator 53. A signal occurs at the output of comparator 53 whenever the output of the filter 44 exceeds by the certain amount the threshold levels established by either the positive or negative envelope detectors. In effect, one may look at the positive and negative envelope detectors along with the window comparator as a full wave rectifier with a threshold level established by the background signal. What is occurring is that the threshold levels are established by the noise; pulses which are greater than the established threshold levels are detected and provided an output to one terminal of OR gate 56.

The signal in the path from the output of filter 44 directly to the comparator 54 is attenuated in the comparator by a factor of four (assuming there is unity gain in the detectors 47 and 48). Consequently, only pulses four times or greater than the noise envelope triggers the comparator 53. In the currently preferred embodiment, the detectors 47 and 48 have an approximately 850 microsecond charging time constant and a 6.8 millisecond discharging time constant; detectors 50 and 51 have an approximately 150 microsecond charging time constant and a 300 microsecond discharging time constant.

The low pass notch filter 45 in the currently preferred embodiment, provides a low pass filter which significantly attenuates (25dB or greater) signals above 200 kHz. The reason for this filter will be described shortly. The output of filter 45 is processed in a similar manner to the output of filter 44. Specifically, filter 45's output is coupled to a positive envelope detector 50, a negative envelope detector 51 and a window comparator 54. Once again, pulses exceeding the threshold levels established by detectors 50 and 51 by the certain amount, produce signals from comparator 54; these signals are coupled to the other terminal of the OR gate 56. However, in this case the carrier signal of received packets set the threshold levels.

Bearing in mind that the purpose of the pulse detector is to blank the modulated carriers when a noise pulse occurs, it would seem that the output of window comparator 53 is all that is needed. It has been found however, that continuous interference may occur at 200-400 kHz since this is the carrier frequency range associated with some power line intercoms. If an intercom is in use, pulses occurring at 200 kHz and above, raise the threshold levels established by detectors 47 and 48, substantially preventing the detection of any noise pulses.

The circuit of FIG. 3 is adaptive in that it compensates for the existence of the intercom disturbance at 200 kHz or above. The intercom signals as shown by FIG. 17, are significantly attenuated by the filter 45. The threshold levels established by the detectors 50 and 51 are primarily set by the signals below 200 kHz. Consequently, when the intercom signal is present, the output of comparator 54 substantially controls the snubbing through the OR gate 56. This is less desirable than using the output of comparator 53, but is a substantial improvement over losing all snubbing during the presence of the intercom signal.

It is more desirable to have the threshold level established by the background noise (as with comparator 53). However, with the intercom signal present, this threshold level is high. For this case, noise exceeding (by a factor of 4) the threshold levels established by the carrier signals in comparator 54 is detected.

The output of the OR gate 56 (SNUBTRY) is coupled to one input terminal of an AND gate 57. The output of the AND gate is coupled to the RST terminal of a flip-flop 59. The Q/output of this flip-flop is the snub control (SNUBCTL) signal on line 61. The S terminal of flip-flop 59 is coupled to the output of a counter 67 through line 72. The clock terminal of the flip-flop 59 receives a high frequency (higher than the baud rate) clocking signal. The clocking signal is used throughout the apparatus and is not shown in FIG. 2.

The flip-flop 59 is used to extend the period of the signals from gate 56. Referring to FIG. 4, two pulses 80 and 81 are shown on line 74 which, for purposes of explanation, are assumed to be noise (the modulated carrier is not shown in this drawing). A typical pulse includes ringing and thus there is a tail extending from the main source of energy. Ideally, as shown along line 75, waveform 82 should be used to snub the pulse 80. Line 76 illustrates the output of the gate 56. This output has a main pulse 84 associated with the peak level of the noise pulse and one or more additional pulses 85 that occur if the tail of the noise is detected. In the currently preferred embodiment, as illustrated on line 77, the width is selectable in the range from 30 to 45 microseconds. This assures that the entire noise pulse is snubbed. As will be seen later, the 30 to 45 microsecond period is not sufficiently long when compared to the baud rate to disturb the detection of a bit or bits which is partially snubbed with one SNUBCTL signal. The input to the S terminal of the flip-flop 59 (line 72) determines when SNUBCTL ends; this input is provided by the counter 67.

The counter 67 receives a 5-bit word from the multiplexer 66. These bits designate one of four times (30, 35, 40 or 45 microseconds). Two bits received from the cell selected one of the four times. An additional signal is used to indicate whether the apparatus is to be used in the United States or Europe to adjust the five bit value due to different clock frequencies. The five bit output of the multiplexer 66 is coupled to the counter 67. Counter 67 is enabled and reset when the Q/output from flip-flop 59 goes high; this output is coupled through a rising edge detector 70. Counting occurs under control of a clock signal. (The main clock signal which is relatively fast, is divided down by the divider 69 before being coupled to the counter 67.) The period of the counting is a function of the five bit input from MUX 66. Once a predetermined count is reached in the counter 67, a signal on line 72 sets the flip-flop 59, ending the snubbing. In this way, the duration of the snubbing pulses are user selected as 30, 35, 40 or 45 microseconds. (One of these periods may be used as a default period if no selection signals are received by the multiplexer 66.)

The SNUBCTL signal will not be in time coincidence with the beginning of the noise pulse because of delays in the filters 44 or 45 and other circuits. This is shown on line 76 of FIG. 4 by time 83. To compensate for this, the modulated carriers, along with the embedded unwanted noise pulses, are delayed by the delay circuit 73. The delayed noise pulses are shown on line 78 of FIG. 4. Line 79 again illustrates the SNUBCTL signal and as can be seen, snubbing occurs in time coincidence with the beginning of the pulse 80 of line 78.

Another consideration is that if too much snubbing occurs, data will be lost. In the currently preferred embodiment, each SNUBCTL pulse results in a hold-off period of a fixed duration during which another SNUBCTL pulse is prohibited. This fixed duration measured from the beginning of the SNUBCTL pulse, in the currently preferred embodiment, is approximately 100 microseconds. This period is shown in FIG. 4.

Assume that a second noise pulse 81 occurs after the first noise pulse 80 within 100 microseconds of the first pulse 80. The output of gate 56 caused by pulse 81 is shown as waveform 86. One might expect that an additional snubbing pulse (shown as dotted line waveform 87) occurs. This is not the case since the circuit of FIG. 3 prevents a second snubbing pulse during the hold off period. Referring to FIG. 3, once a SNUBCTL pulse occurs, flip-flop 60 is set, thus its Q/output drops. This prevents gate 57 from passing signals such as waveform 86 of FIG. 4 onto the flip-flop 59. The beginning of the SNUBCTL pulse also resets and enables counter 91 because of the output from detector 70. Once a predetermined count is reached in counter 91 (corresponding to 110 microseconds), a signal on line 88 occurs resetting flip-flop 60. The Q/output of flip-flop 60 goes high, allowing signals to be passed through gate 57. Consequently, once a SNUBCTL signal occurs, no additional snubbing is possible for 110 microseconds.

The fact that a second noise pulse 81 occurred and was not snubbed, is used in the invented apparatus. The occurrence of the pulse 81 and the waveform 86 (without snubbing) causes the generation of the hint signal at time 89 shown in FIG. 4. This signal is transmitted over line 36 to the decoder 34 (FIG. 2). As will be discussed later, if an error is detected in a word associated with unsuppressed noise, the noise may have changed the state of the data occurring at the time of the noise. That is, for the single frame shown along line 83, if a binary 0 is detected for that bit, and a second impulse 81 is detected, one step that may be taken in the correcting process is to change the state of this bit from a binary 0 to a binary 1. Circuit 34 determines whether this state change is required while the snub hint acts as a pointer indicating which bit to change. (The circuit that generates the hint signal and its timing are discussed in conjunction with FIGS. 8 and 9.)

Referring to FIG. 5, the effect of the snubbing on a received signal is illustrated for a BPSK case. A single noise pulse is shown on line 92 which is assumed to occur with a carrier. Waveform 93 shows the modulated carrier during two baud intervals; the first baud interval is modulated with a binary 0 and the second baud interval is modulated with a binary 1. (Note the phase shift in the carrier between the first and second baud time.) Line 94 illustrates the SNUBCTL signal generated as described above. On line 95 the effect of the snubbing signal on the demodulation signal is shown. During the period 99 there is no signal to detect because the carrier signal is interrupted by the switch 63 of FIG. 3. The detected signal is illustrated on line 96 at the output of filters 32. The binary 0 is detected at time 100 by the slicer 31. The binary 1 following this binary 0 should cause the signal to follow the waveform indicated by the dotted line 97, assuming no disturbance occurred and no snubbing occurred. However, since a portion of the waveform on line 95 was snubbed, the actual waveform on line 96 falls short of its expected amplitude by the amount 98. Nonetheless, a binary 1 is detectable since the voltage represented by 98 is relatively small compared to the total magnitude of the waveform 97. If, on the other hand, a hold-off period was not implemented, additional energy may be lost from the modulated signal from more snubbing, and the binary 1 may not be detectable. (Depending upon the relative duration of the bit period and snubbing period, two or more snubbing pulses may be used during a single frame in some systems.)

The relative amplitudes shown in FIG. 5 are for purposes of explanation and are not necessarily representative of actual amplitude. For instance, the amplitude of the disturbance causing pulse is often much larger than the modulated carriers. This is particularly true for the examples set out in FIG. 1 where the transmitter is far from the receiver and the source of the noise close to the receiver. The energy associated with the disturbance pulses is often sufficiently large (if not snubbed) to prevent the correct detection of the binary data.

SNUB Hint Generator Circuit

Referring to FIG. 8, the snub hint generator includes an AND gate 112; the output of this gate is coupled to the reset terminal of the flip-flap 113. The Q/output of the flip-flop 113 is coupled to the D input of the flip-flop 113. The Q output of flip-flop 114 is coupled to the D terminal of the flip-flop 115. The Q output of flip-flop 118 provides the snub hint on line 36 of FIG. 2.

The inputs from FIG. 3 to the AND gate 115 are the SNUBTRY signal, the SNUBCTL signal (line 61) which is coupled to an inverting terminal and the SNUBENABLE signal which is also coupled to an inverting terminal. The SNUBFRAME signal is coupled to the S terminal of the flip-flop 113 and the CE terminal of the flip-flop 114. The main clock from FIG. 3 is coupled to the clock terminals of flip-flops 113 and 114. The baud clock from FIG. 3 is coupled to the flip-flop 115.

As will be described in conjunction with FIG. 9, the flip-flop 113, in essence, provides an asynchronous reset controlled by the output of gate 112. The flip-flops 114 and 115 resynchronize the hint signal to bring it into the baud boundary so that it can be used by the ECC decoder.

In FIG. 9, the top waveform illustrates received signal at the snub switch; two bits for data X and Y are used for purposes of explanation. The relationship between the baud clock and snub frame signal is shown in FIG. 9. The SNUBFRAME signal is coupled from the bit synchronization circuit 30 of FIG. 2 to the snubber 22. As can be seen, the SNUBFRAME signals occur before each baud clock. The SNUBTRY waveform (the output of the OR gate 56 of FIG. 3) indicates that during the X frame two disturbances are detected as indicated by the pulses 117 and 118. When the first pulse occurs, the SNUBENABLE signal (output of flip-flop 60 of FIG. 3) drops in potential as indicated at the trailing edge 119 of the enable signal. This prevents the generation of a second SNUBCTL signal during the frame. A SNUBCTL signal (line 60 of FIG. 3) is generated as indicated in FIG. 9. The output of the flip-flop 113, line 120, is also shown in FIG. 9. With the second SNUBTRY pulse 118, the flip-flop 113 is reset and line 120 rises in potential. On the next SNUBFRAME pulse, the output of flip-flop 113 is clocked into the flip-flop 114 as indicated by the waveform in FIG. 9. Finally, the flip-flop 115 synchronizes the output of flip-flop 114 with the baud clock, thereby providing the snub hint for the frame X. As can be seen, data received at the ECC decoder for frame X occurs at the same time as the snub hint for frame X.

Error Correcting Method and Apparatus

As mentioned, the encoder 11 encodes data with a Hamming code and a decoder 34 decodes the data. Referring to FIG. 6, the output of a cell 100 is illustrated by an 8-bit digital word 104. These 8 bits are transmitted to a power line communications apparatus 101 such as shown in FIG. 2. Once received, three bits 105 are attached to, or placed within, the 8-bit word. The bits 011 become the most significant three bits in an 11-bit data word. These bits are placeholder or dummy bits and are only used to permit use of an available (15, 11) Hamming code. This Hamming code operates on 11-bit words and provides a four bit Hamming section. The four bits can detect and correct a single error in the 11 bits. The 11 bits comprising the 8-bit word (the real data) and the three placeholder bits are encoded through encoder 109 employing the well-known (15, 11) Hamming code. This results in 15 bits: three placeholder bits, the data (8 bits), and the 4-bit Hamming code 106. Additionally, a parity bit 107 is added to supplement the Hamming code, thereby providing detecting (but not correction) of double bit errors. Before data is transmitted onto the receiver 102, the three placeholder bits are stripped from the word. Thus, only 13 bits are transmitted.

The particular placeholder bits (011) are selected to maximize the number of transitions (and minimize D.C. drift) in the coded output sequence.

Once the 13 bits are received within the receiver 102, the same 3 bit code as the previously used for placeholder bits are again placed in the same position in the word. That is, for the example used, 011 shown as three bits 108 become the most significant three bits of an 11-bit data word. All the transceivers in a given system, of course, must use the same placeholder bits and place them in the same relative position prior to encoding and decoding. Now the ordinary Hamming decoder 110 can operate upon the 11 bit data word and the four Hamming code bits in an ordinary manner. The output of the decoder 110 includes the three placeholder bits which are stripped from the word. The Hamming code and parity bits also are not needed after decoding, therefore, only the 8-bit word is transmitted to the cell 103. (Note: Other parity bits or other encoding may be used between the cells and their respective transceivers independent of the Hamming code and parity bit used between the transceivers.)

Referring again to FIG. 2, the encoder 11, for the reasons described above, includes means for adding the three placeholder bits for calculating the Hamming code, and means for removing the placeholder bits prior to the summation that occurs at summer 13. Similarly, the decoder 34 includes means for adding the three placeholder bits prior to decoding, and means for removing the placeholder bits after decoding and prior to coupling the data to the I/O buffer and control circuit 10.

For QSPK encoder 11 interlaces the 13 coded bits from two words. (If the bits in the two words are numbered consecutively 1–26, the bits in the interlaced words are 1, 13, 2, 14, 3, 15 ...). The decoder 34 "de-interlaces" the words into their original, non-interlaced order. Consequently, for example, the "01" state represents a "0" in one word and a "1" in the next word. The reason this is done is to avoid having the loss of data for one baud period causing two errors in one word. Rather, the loss is associated with two words. This gives the Hamming code a better chance at correcting infrequent single errors. Also a "hint" for a particular baud period applies to two bits, one in each word for this interlacing.

The (15, 11) Hamming code permits the detection and correction of a single error per word, as mentioned. With the addition of a parity bit as used in the currently preferred embodiment, a second error can be detected in each word. However, without use of the present invention, the second error cannot be corrected without other coding. With the present invention, the hint on line 36 of FIG. 2 is used along with the parity bit to correct a second error, if one occurs.

In FIG. 7, the logic implemented in the currently preferred embodiment to make use of the hint is illustrated. First, as shown by block 112, an ordinary circuit within decoder 34, examines the data (with the placeholder bits) and the Hamming code bits to determined if an error is present in the word. Also the data is checked to determine if the parity is correct. This is shown by Hamming and parity check in block 112. Block 113 illustrates what occurs if both the Hamming and parity checks indicate that the data is correct. In this instance, it is assumed that the data word is correct. For this case, even if a hint is available for one or more bits in the word, it is ignored since it is assumed that the pulse generating the hint did not corrupt the binary data.

Next, consider the case where the Hamming check indicates the data is incorrect and the parity also indicates that the data is incorrect (block 114). For these conditions, it is apparent from the parity mismatch that there is an odd number of errors and it is assumed there is only one error. Since the Hamming check is bad, the error must be in the data or in the four bits of Hamming code. Here the hint, if available, is ignored and the Hamming code is used to correct the error. This is indicated by block 115.

Assume now that the Hamming check is good and the parity check is bad (block 116). The number of errors is odd, thus it is assumed that there must be one error. Since the Hamming check is good, the error must be in the parity bit. Under these circumstances, the parity bit and hint, if available, are simply ignored and the word is used as indicated by block 117.

Finally, block 118 shows the case where the Hamming check is bad and the parity check is good. Under these conditions, there must be an even number of errors; it is assumed that there are two errors. Here the hint is used. If there is no hint, the data is not changed. (Higher levels of protocol deal with these errors-for example a cyclic redundancy code (CRC) is used.) If there is one or more hints, then one of the bits associated with a hint signal is inverted. It is now assumed that there is only a single error. The Hamming code is used to correct the remaining error (block 120). If the hint points to the parity bit, after correcting the parity bit, both the Hamming check and parity check will be bad. This indicates that the remaining error can be corrected with the Hamming code (as discussed for block 114). Also, under the condition shown by block 118, if the hint points to the data/Hamming code, and after inverting the bit associated with the hint signal, the Hamming check is bad, and the parity check bad, the other error lies in the data/Hamming code (again this can be corrected as discussed for block 114). On the other hand, if the second error lies in the parity bit, the data/Hamming section check will be good and the parity check bad (this is the case of block 116).

If more than one hint is generated for a given word, one of the hints (e.g., first hint) may be used. Other uses of more than one hint are possible, for example, if two hints are generated both hints could be used for certain coding that detects and corrects multiple errors.

In the currently preferred embodiment, as described above, the detection of noise pulses is used to generate the hint signal. The hint signal may be generated where other means are used to identify anomalies in the waveform. For instance, in a phase lock loop, frequently used in the demodulation process, abrupt changes in phase in the loop can be detected and used to generate a hint signal. Alternately, the snubbing signal itself may be used to generate the hint signal. Note from FIG. 5, waveform 96, that once snubbing occurs the noise margin decreases as indicated by the difference between the expected waveform 97 and the actual waveform 98. Consequently, there is a greater likelihood that a misdetection will occur for a snubbed signal. Hence, the hint signal can be generated for datum which is snubbed. Also, the hint signal may be used in ways different than that described above to verify the data. Again, by way of example, each byte can be transmitted twice with each transmission occuring at a different time. The received redundant bytes can then be compared. If they are the same, it can be assumed the data is correct. On the other hand, if there is a mismatch, and a hint signal is generated, the state of the bit associated with the hint signal can be changed and the bytes again compared to see of the suspected error is corrected.

Adaptive Carrier Detection Threshold Circuit

Referring briefly again to FIG. 2, the two channel carrier detect and adaptive carrier detect threshold circuit 29 includes a carrier detect mechanism having two sections; one for each channel. This mechanism uses well-known principles and for this reason it is not set forth in detail. This is also true for the carrier synchronization circuit 26. What is novel, however, is the adaptive carrier detection threshold level; it automatically changes level depending on noise conditions. This adaptive carrier detection threshold level is generated within circuit 29 of FIG. 2. In summary, this adaptive threshold is generated using unsupervised learning implemented by the equations shown in FIG. 10 and data quality estimator the specific coefficients of which are shown in FIG. 15.

In the following description, the processing and circuitry for a single channel are described; in the currently preferred embodiment, circuitry is employed to generate an independent carrier detection threshold level for each channel.

The circuit 29 of FIG. 2 implements the state diagram of FIG. 10. A circuit determines if the received signal is greater than a stored carrier detection threshold level. On initialization this level is set to a maximum value as indicated by line 136. If the received signal is greater than the carrier detection threshold level, presumably a carrier is present and as indicated by line 133, the carrier detection threshold level is held constant (block 135). Carrier detection occurs within this same circuit 29, but is not shown in FIG. 10. If on the other hand, the received signal is less than the carrier detection threshold level, (indicating no carrier or threshold level too high) the threshold level is updated as indicated by line 132 and block 134 and as explained below.

The threshold level is a function of the average noise as indicated by equation 137 multiplied by a constant (k) which is sufficiently large to assure that the threshold level is above the noise, (e.g., k=4). The average noise level for the n+1 sample is computed as shown by equation 138 of FIG. 10 from the average noise level found for the $n^{th}$ sample and the magnitude of the noise for the $n^{th}$ sample. This magnitude is a real function of both the real and imaginary components of the demodulated and filtered received signal. The multiplication factor 1/64 shall be discussed later. The sample rate is the baud rate. (The circuit operates on the assumption that traffic is relatively light, therefore, there will be enough time without carrier presence to allow the threshold level to be established relative to the background signal or noise. Put another way, the received signal of FIG. 10 is composed of background noise a sufficiently large amount of the time such that the threshold level is set by it and not the carrier.)

(For the above state diagram and for other cases where determinations are made as to whether a value is "greater than" or "less than" another value, the specific conditions when the two values are equal to one another is not covered. The condition of equality and its resolution can be selected as either "greater than" or "less than".)

Referring to FIG. 11a, assume there are a plurality of data packets such as data packet 139 and that the magnitude of the carrier modulated with these packets is above the carrier detection threshold represented by line 140 and above the average noise level represented by line 141. This shows ideal conditions. There is a high signal to noise ratio and the carrier detection threshold level is between the signal and noise. The occurrence of carrier detection is shown by line 142. When the carrier detect signal is in its high state, the carrier detection threshold level remains constant as indicated by block 135 of FIG. 10.

When no carrier is present, the threshold level is able to track the noise level. For instance, as indicated by arrow 143, as the noise drops, so does the carrier detection threshold level. The rate at which the threshold level tracks the average noise is determined by the multiplication factor which is shown as 1/64 in equation 138. As can be readily seen in FIG. 11a, the threshold level remains above the average noise because of the constant (k) of equation 137.

The state diagram of FIG. 10 can be latched into two undesirable states; one shown in FIG. 11b and the other in FIG. 11c.

Referring first to FIG. 11b, assume that the carrier detection threshold level is above the level of the carrier as indicated by arrow 145 and that the signal level of the carrier is substantially above the noise level as indicated by arrow 144. This condition can occur on initialization or other reset when the threshold level is set to a maximum value. In this condition the packets are not recognized by the carrier detect function because the carrier detect threshold is too high. Assuming gaps exist between packets, eventually the average noise estimator $N_{AVG}$ of FIG. 10 will drift down due to the action of equation 138 bringing the carrier detect threshold (equation 137) down also. The drift rate is determined by the coefficient 1/64 used in equation 138 which controls how rapidly the noise estimator $N_{AVG}$ is driven to match the actual received noise, $N_{MAG}$. Within a few hundred samples the condition of FIG. 11b is cured for the worst case. The coefficient (i.e., 1/64) must be large enough for relatively fast recovery from the condition shown in FIG. 11a. However, it can not be selected to be too large since then a few noise samples may improperly bias the threshold level.

Referring to FIG. 11c, assume that the average noise level is below the carrier level as indicated by arrow 147, and that the carrier detection threshold level is below the average noise level as indicated by arrow 148. This condition can be caused by different anomalies, such as a very sudden change in noise level. Referring to the state diagram of FIG. 10, the received signal is greater than the carrier detection threshold level, hence the circuit is in the state indicated by block 135, that is, the carrier detection threshold level is held constant. The circuit is now latched in that the carrier detection threshold will remain constant, and since it is below the noise level, carrier detect will be held permanently ON and for a circuit to automatically recognize packets will not be properly detected. This is a difficult condition. Circuit 29 examines the output of filters 32 and determines whether noise or data is present to correct this condition, as described below.

Before discussing the specific circuitry used in circuit 29 for detecting the condition of FIG. 11c, it will be helpful to understand the principles employed by this circuit. Referring first to FIG. 12, a polar plot of signal samples for a channel is shown. The horizontal line represents the in-phase component of the demodulated received signal while the vertical line represents the quadrature component of the demodulated received signal. If in fact data is present, the data points will fall within the data constellations 150, 151, 152 and 153 for QPSK. (BPSK is discussed below.) Note that each constellation is approximately centered about the average magnitude of the signal level. By way of example, "00" is represented by the constellation 150 and a transition to "10" would cause a data point to shift to constellation 153. The data constellations can be readily viewed on an oscilloscope. On the other hand, if no data is present but rather only noise, the noise will be centered about the graph's origin as indicated by line 154. Looked at another way, the phase angles associated with the noise are random and therefore the noise signal will be distributed in a circular symmetric manner about the origin.

The present invention utilizes the principles illustrated in FIG. 12 to determine if noise rather than data is present. This is shown in FIG. 13 by the diagram which resembles a dart board. The inner-most circle represents one half the average (received) signal level (at the output of filters 32), the next circle the average signal level while the outer circle represents twice the average signal level. The data points should appear within the constellations 150, 151, 152 and 153. The circuit in effect gives high scores to signals which appear in these constellations and low scores to signals appearing outside the constellations. The scoring over many baud period is averaged and used to detect and correct the condition of FIG. 11c. In practice as will be seen, each quadrant is broken into eight segments and the various zones are assigned coefficient values stored in a look-up table. The specific values assigned are shown in the "score" table of FIG. 15.

In the currently preferred embodiment, the circuit shown in FIG. 14 is realized with a microprocessor using digital signal processing once the I and P signals are digitized. A Texas Instrument TMS-32020 is used; FIG. 14 is shown since it provides more insight into the operation of the present invention.

Each channel includes one of the circuits shown in FIG. 14. Each of these circuits receive its respective in-phase and quadrature phase signals. These signals are coupled to analog-to-digital converters 157 and 158, respectively. (In practice, a single converter is used with the input and output multiplexed to provide two outputs). Next, the phase angle is computed for the complex number represented by the output of the converters. While numerous known algorithms may be employed, in the currently preferred embodiment, a set of linear comparisons are used to classify the phase angle into one of 32 values. These 32 values are represented by a 5-bit digital word at the output of the compute phase angle means 159. This 5-bit word is used as a look-up to the constant table ROM 160. The constant table provides the sine and cosine of the angle. The magnitude computation means 161 is used to compute the magnitude of the complex quantity represented by the I (in-phase) and Q (quadrature) data for the channel. This is done using the sine values ($K_1$) and cosine values ($K_2$) from table 160.

Next, the magnitudes are averaged in the averaging means 162. This averaging is done over 16 baud intervals in the currently preferred embodiment. Now, in the comparator 163, each magnitude from means 161 is compared to twice the average magnitude, the average magnitude and one half the average magnitude. The results of this comparison are encoded into a 2-bit word which, along with the phase angle, provide a look-up (address) to a score table (ROM) 164. This score table is programmed with the values shown in FIG. 15. Only a single quadrant is shown in FIG. 15, the other quadrants have values which are in mirror correspondence to those shown in FIG. 15.

The first of the conditions shown for comparator 163 that is satisfied for a given magnitude is the correct one. That is, if a magnitude is greater than twice the average magnitude (computed from the last 16 magnitudes) only the values beyond the outer most circle of FIG. 15 apply. (This magnitude, of course, is also greater than the average or ½ the average magnitude.) Also, by default, if a magnitude is less than ½ the average magnitude, the values within the inner most circle apply. Thus, by way of example, if the average magnitude is 7, and the current magnitude is 3 at an angle of 16.9°, the value from table 164 is −454.

By way of another example, assume that a sample is greater than one half the average (but less than average) and falls within the first increment of phase angle. The output of the score table for this case will be 0.25. This value is communicated to the averager 165 and used to form an average. If the next sample falls within the fourth increment of angle and is greater than twice the average, the next value communicated to the averager 165 is −2.816 which is next used in the averaging process. In the currently preferred embodiment, the score table 164 provides a 16-bit output and is averaged over 64 samples in the averager 165. The output of the averager 165 may be looked at as being an indicator of signal-to-noise ratio although it is not precisely this quantity.

On initialization, a high average number indicating "data" not "noise" is placed within the averager 165.

The output of the averager 165 is compared to the quantity 0 (in analog or digital form) as indicated in FIG. 14 by the comparator 166. If the value is greater than 0, an output occurs from the comparator 166 indicating "data". If no output is present there is only noise in the channel. This output after inversion is gated through the AND gate 167 if the carrier detect signal is high. An output from gate 167 indicates a latched state. This signal causes a reset to a higher value of the carrier detect threshold level (see line 136 of FIG. 10), thereby raising the threshold level and breaking the latched condition of FIG. 11c. This frees the circuit 29 and allows it to proceed to the condition shown in FIG. 11b and from there the threshold value is recomputed until the carrier signal is detected.

The computations and computational means of FIG. 14 are realized with well-known circuits and processors.

The circuit of FIG. 14 is used for the BPSK case. The same score table is used, even though for BPSK the data constellations are only present on the real axis. A separate table with different coefficients may be used which gives low scores along the entirety of the quadrature axis to optimize the system for BPSK. This will provide a faster recognition time for BPSK than is provided with the table shown in FIG. 15.

Channel Selection Circuit

Referring again to FIG. 2, as mentioned, two channels of the same data are coupled to the channel selection or addition circuit 33. There, one of two channel is selected or the channels are combined. It is the channel with the least noise that is selected, this is not necessarily the channel with the strongest signal strength. If the noise in both channels is relatively close, data in the channels is summed. The selection or summing has the effect of reducing transmission error since in power lines most of the errors are caused by noise.

The circuit 33 is shown coupled between the filters 32 and slicer 31 in FIGS. 2 and 16. (The circuitry above dotted line 192 of FIG. 16 is in circuit 33; the circuitry below the dotted line 192 is in circuit 29.) The circuit of FIG. 16 receives the carrier detection threshold level for the two channels. The threshold level may require scaling, amplification or buffering before being applied to the circuit of FIG. 16 as is well known in the art.

The circuits shown in FIG. 16 are analog components. It will be appreciated that the circuit of FIG. 16 may be realized as a digital circuit as well.

The threshold level for the first channel is coupled to the negative input terminal of a comparator 176 and to an amplifier 190. Amplifier 190 provides a gain (k) of 1.4; hence, 1.4 times this threshold level for the first channel is coupled to the positive input terminal of the comparator 175. Similarly, the threshold level for the second channel is coupled to the negative input terminal of the comparator 175 and 1.4 times this level is coupled to the comparator 176 through amplifier 191 (again K=1.4 or 3 dB).

The output of comparator 175, controls switches 173 and 174. Similarly, the output of the comparator 176, controls switches 171 and 172. The resistors 179 and 182 are coupled in series between the in-phase lines of the channels while the resistors 180 and 181 are coupled in series between the quadrature lines of the channels. Resistors 179, 180, 181 and 182 are all of equal resistance. The junction between resistors 179 and 182 provides the final in-phase signal, while the junction between resistors 180 and 181 provides the final quadrature signal.

The equations implemented by the circuit of FIG. 16 are shown in this figure. It is assumed for purposes of discussion, that the coefficient (k) is equal to 1.4. If the threshold level in the first channel is greater than 1.4 times the level in the first channel, the second channel is turned off. In this case there is more noise in the first channel. Here the output of gate 176 is low, and switches 171 and 172 are open. The output of comparator 175 is high, causing switches 173 and 174 to be closed. I2 and Q2 are thus coupled to the slicer 31 through resistors 182 and 181, respectively. Similarly, if the threshold level in the second channel is greater than 1.4 times the threshold level in the first channel, the output of comparator 175 is low, causing switches 173 and 174 to open. This couples only the signals from the first channel to the slicer 31. If the threshold level of the first channel is less than 1.4 times the threshold level of the second channel, and if the threshold level of the second channel is less than 1.4 times the threshold level of the first channel, switches 171, 172, 173 and 174 will close. This sums the in-phase signals from both channels and sums the quadrature signals from both channels.

The use of the dual channels works particularly well where the frequency separation between the two channels is properly selected. If we assume for a moment that the lowest frequency used in switched power supplies is approximately 25 kHz (which it is for most recently manufactured switched power supplies), the frequency separation between the channels should be less than 25 kHz. The reason for this is that the switching signals (both fundamental frequency and harmonics) from the switched power supplies will always be separated by at least 25 kHz. If a harmonic from a switched power supply were, for instance, at 118 kHz (one carrier frequency) thereby distorting the data is one channel, the next higher harmonic from that power supply will fall above 133.3 kHz (the other carrier frequency) thereby permitting the second channel to be used. Therefore, the frequency spacing between the two channels should be less than the fundamental frequency of the noise source to optimize the benefit of the two channel approach.

Thus, a PLC apparatus has been described which has many advantages over prior art devices.

I claim:

1. In an apparatus for receiving a signal representing digital data, said signal being transmitted over a power line to said apparatus, an improvement comprising:

detection means for detecting noise pulses on said power lines said detecting means including frequency dependent means for detecting noise pulses occurring at and above a first frequency and for preventing said noise pulses at and above said first frequency from blocking detection of noise pulses at frequencies below said first frequency; and, snubbing means for suppressing said signal representing digital data under control of said detection means, said detection means being coupled to said snubbing means, said snubbing means being controlled by said noise pulses below said first frequency.

2. The apparatus defined in claim 1 wherein said detecting means includes a filter the frequency characteristics of which define a notch at said first frequency.

* * * * *